United States Patent [19]

Rösl et al.

[11] Patent Number: 4,782,243
[45] Date of Patent: Nov. 1, 1988

[54] PULSE GENERATOR

[75] Inventors: Wolfgang Rösl, Eckental; Jochen Rose, Röthenbach, both of Fed. Rep. of Germany

[73] Assignee: Standard Elektrik Lorenz AG, Stuttgart, Fed. Rep. of Germany

[21] Appl. No.: 122,436

[22] Filed: Nov. 19, 1987

[30] Foreign Application Priority Data

Nov. 21, 1986 [DE] Fed. Rep. of Germany ....... 3608930

[51] Int. Cl.⁴ ............................................. H01H 25/00
[52] U.S. Cl. ................................... 307/106; 307/112; 200/5 R; 200/6 R; 200/6 A
[58] Field of Search .................. 307/106–112, 307/105, 132 R; 200/5 R, 5 A, 5 C, 5 E, 4, 6 R, 6 A, 6 B, 6 BA, 6 BB, 6 C, 16 F, 16 R, 16 B, 17 R, 18, 33 D, 153 T, 153 N, 153 LB, 153 P, 276, 246, 283, 288

[56] References Cited

U.S. PATENT DOCUMENTS 3,784,746 1/1974 Hess ........................................ 200/4
3,821,498 6/1974 Schaefer et al. ..................... 200/6 A
3,919,506 11/1975 Kellogg ............................... 200/16 A

FOREIGN PATENT DOCUMENTS 1765607 7/1971 Austria .
1109762 1/1962 Fed. Rep. of Germany .
558560 1/1975 Switzerland .

Primary Examiner—William M. Shoop, Jr.
Assistant Examiner—Paul Ip
Attorney, Agent, or Firm—Spencer & Frank

[57] ABSTRACT

A pulse generator with a pin-shaped switching plunger for actuating at least one contact is so designed that many switching positions are possible. It is characterized in that the switching plunger (3), which is guided in a housing, is slidable in the direction of and rotatable about its longitudinal axis (5), and that the switching plunger (3) is provided with at least one actuating member (4) which can enter into nonpositive engagement with at least one contact (2.1 to 2.8 and 1.1 to 1.8) both in any of the longitudinally shifted positions and in any of the rotated positions.

16 Claims, 4 Drawing Sheets

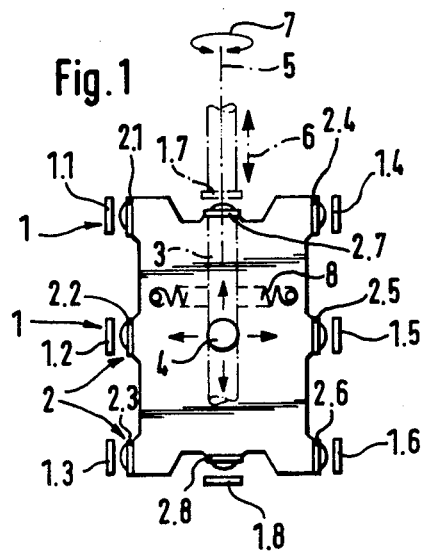
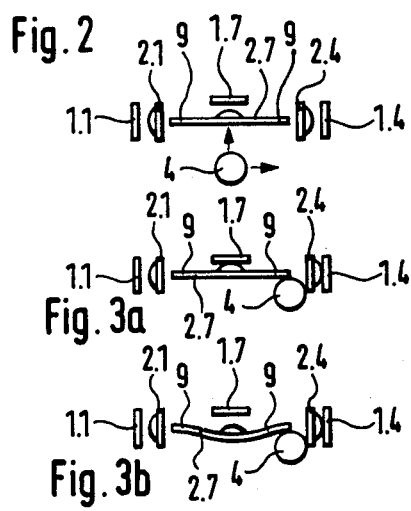
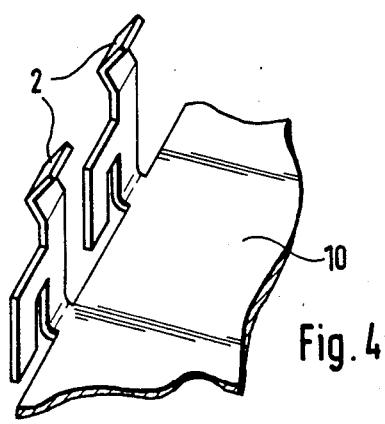

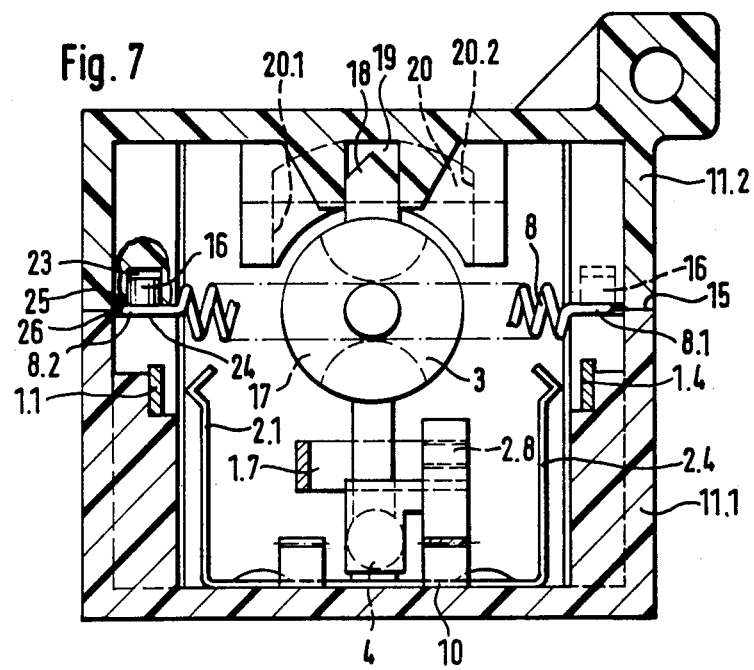
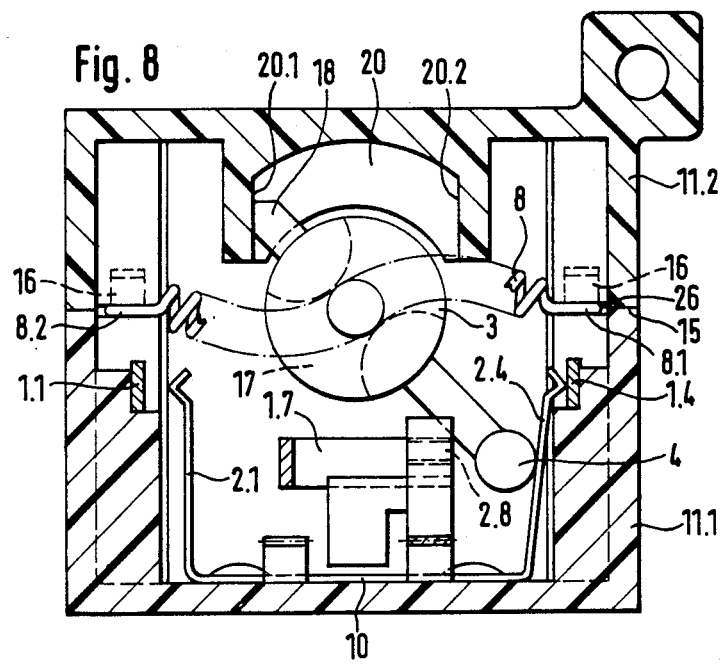

PULSE GENERATOR

DESCRIPTION

The present invention relates to a pulse generator as set forth in the preamble of claim 1.

Pulse generators of this kind with only one contact are known as so-called keyswitches. In such switches, at least one contact is opened or closed by depressing the switching plunger.

The object of the present invention is to design a pulse generator so that several switching positions are possible, and that a contact can be actuated in several or all possible switching positions.

This object is attained by the features set forth in the characterizing part of claim 1. In this manner, several longitudinally shifted and at least two rotated switch positions can be obtained without a major design effort. According to an advantageous feature of the invention, only a single tension spring is necessary to restore the switching plunger from any switching position to the rest position.

Further advantageous details of the invention are given in the subclaims and will now be described with the aid of the embodiments illustrated in the accompanying drawings, in which:

FIG. 1 shows the principle of the pulse generator in a top view;

FIGS. 2, 3a and 3b show an embodiment for actuating several contacts in one plane;

FIG. 4 shows part of a contact plate;

FIG. 7 is a section taken along line A-B of FIG. 5 in the rest position of the switching plunger;

FIG. 8 is a section taken along line A-B of FIG. 5 in a rotated position of the switching plunger;

Figure 5:
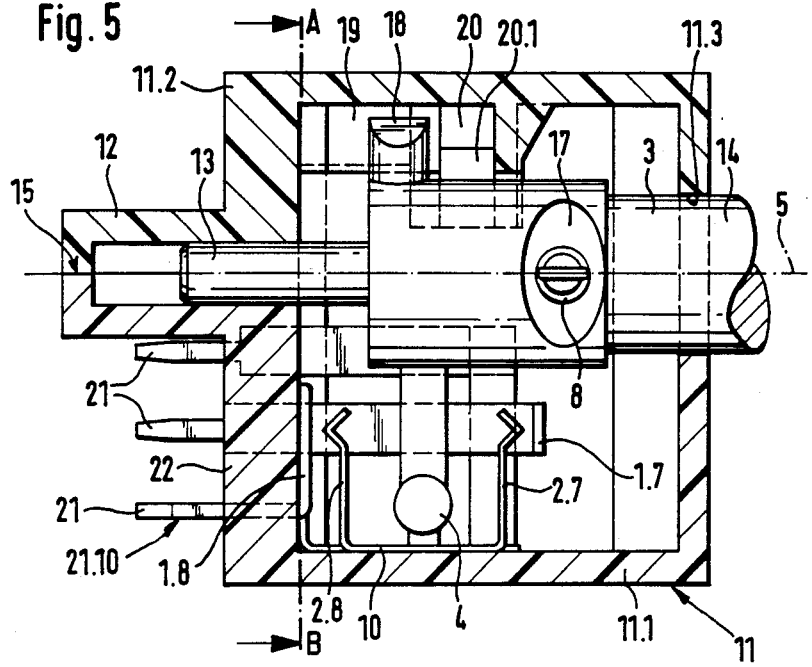
FIG. 5 shows a pulse generator in a sectional side view.

The reference numerals 1, 1.1 to 1.8 designate fixed contacts which face movable contact springs 2, 2.1 to 2.8 located at a distance therefrom. A switching plunger 3, indicated in FIG. 1 by broken lines, is provided with an actuating member 4. The latter projects radially, i.e., downwardly in the position shown in FIG. 1. The plunger 3 is supported in a housing (not shown in FIG. 1) or a part of a housing so as to be slidable in the direction of its longitudinal axis 5 (arrow 6) and rotatable about its longitudinal axis 5 (arrow 7).

The plunger 3 can be fixed in its rest position by a tension spring 8. The rest position is the intermediate position shown in FIG. 1. The tension spring 8 is mounted perpendicular to the longitudinal axis 5 and extends through a hole of the plunger 3, so that it can pull the plunger 3 from any possible pulled, depressed and/or rotated position back to the rest position. It thus acts as a restoring spring. In the schematic representation of FIG. 1, the movable contact spring 2.7 can be forced against the fixed contact 1.7 by pulling the actuating member 4 upwards in the plane of the paper, thus closing the contact. After release of the plunger 3, the latter returns to the rest position under the action of the tension spring 8. By depressing the plunger 3, the contact 2.8, 1.8 can be closed in similar fashion as long as the necessary pressure is maintained.

If the plunger 3 is rotated out of its rest position, the actuating member 4 can close the contact 2.2, 1.2 or 2.5, 1.5, depending on the direction of rotation.

The contact 2.1, 1.1 or 2.4, 1.4 can be operated by additional pulling during rotation, and the contact 2.3, 1.3 or 2.6, 1.6 by depression and rotation.

According to an advantageous feature of the invention, which is shown in FIGS. 2 and 3, at least one movable contact spring, here the contact spring 2.7, has at least one lateral actuating extension 9 which extends into the range of actuation of an adjacent contact, here the movable contact springs 2.1 and 2.4. By pulling and simultaneous rotation, two contacts can then be actuated simultaneously. In FIG. 3a, this is shown schematically for the contacts 2.7, 1.7 and 2.4, 1.4. With slanting extensions 9 as shown in FIG. 3b, the two contacts 2.7, 1.7 and 2.4, 1.4 can be actuated one after the other in one pulling plane.

FIG. 4 shows an embodiment of the movable contact springs 2 at a common contact plate 10. The contact springs 2 are bent at approximately right angles to the plane of the contact plate 10 and project inwardly in the pulse generator.

FIGS. 5 to 10 show a practical embodiment. The pulse generator has a suitably closed housing 11. The latter consists of a part 11.1, which receives the contact plate 10, and a cover part 11.2. The housing 11 has a preferably externally closed bushing 12 into which the plunger 3 projects with a centering pin 13, which is slidably and rotatably supported in the bushing 12. The end of the plunger 3 opposite the centering pin 13, the end 14, is rotatably and slidably supported in a bearing opening 11.3 of, and protrudes from, the housing 11. The parting line 15 between the housing part 11.1 and the cover part 11.2 runs in the direction of the longitudinal axis 5 of the plunger 3 and centrally through the bearings, namely the bushing 12 and the bearing opening 11.3. This permits the plunger 3 to be fitted in a simple manner by insertion.

Figure 6:
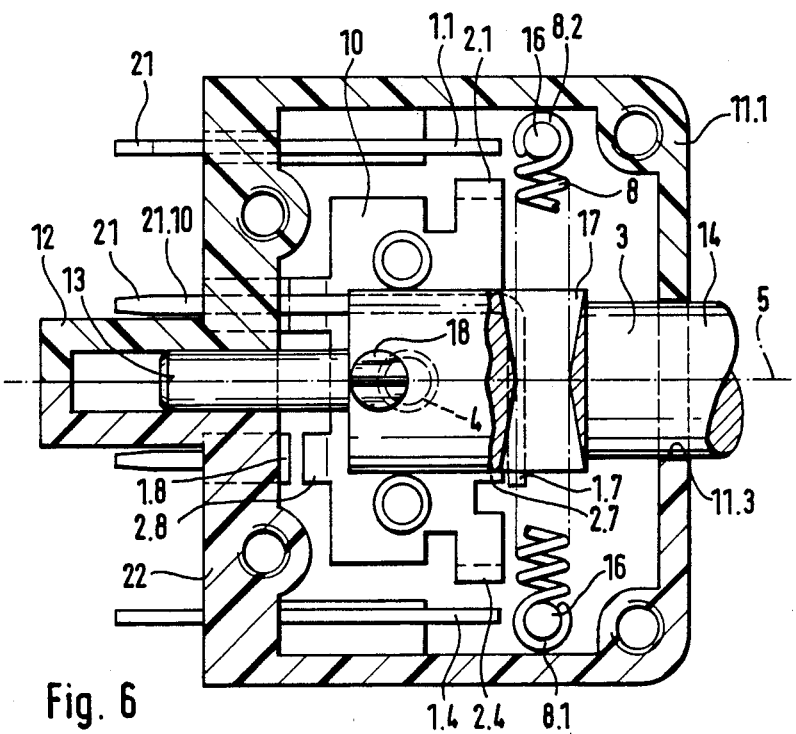
FIG. 6 is a sectional top view.

The tension spring 8 is provided with an eye hook at each of its ends 8.1 and 8.2. Attached to or formed on the housing part 11.1 are pins 16 over which the ends 8.1 and 8.2 can be slipped to mount the tension spring 8. The tension spring extends through a cross hole 17 of the plunger 3. The cross hole 17 preferably widens outwardly in the form of a funnel (FIG. 6).

A locking projection 18 may be provided on the plunger 3, preferably on the side opposite the actuating member 4. In at least one switching position, it extends into a recess 19 in the housing part 11.1 of the cover part 11.2 which is shaped so that the plunger 3 can be rotated, but can only be moved longitudinally. In another switching position, a wider recess 20 may be provided in the housing part 11.1 or the cover part 11.2. If, in this switching position, the locking projection 18 is in the wider recess 20, the plunger 3 can be rotated. The sidewalls 20.1 and 20.2 of the wider recess 20 serve as stops for the projection 18, and thus as means for limiting the rotation range of the plunger 3 (cf. FIG. 8). The projection 18 may also be provided on the housing 11, in which case the recesses 19 and 20 are in the plunger 3.

The contact plate 10 has at least one terminal pin 21.10, which is brought out through a wall 22 of the housing. The fixed contacts 1.1 to 1.8 can be contacted from outside via terminals pins 21 passing through a wall of the housing, e.g., the wall 22. Preferably, all terminals pins 21 and 21.10 protrude from the housing 11 on one side, thus permitting simple assembly and contacting by plugging. They are preferably arranged with a given grid spacing. In a preferred embodiment, the terminal pins 21 and 21.10 are designed as flat contacts. In this case, the surface of at least one of the same may be contained in a plane other than that of another. This guarantees proper insertion even if the terminal pins are arranged symmetrically.

Figure 9:
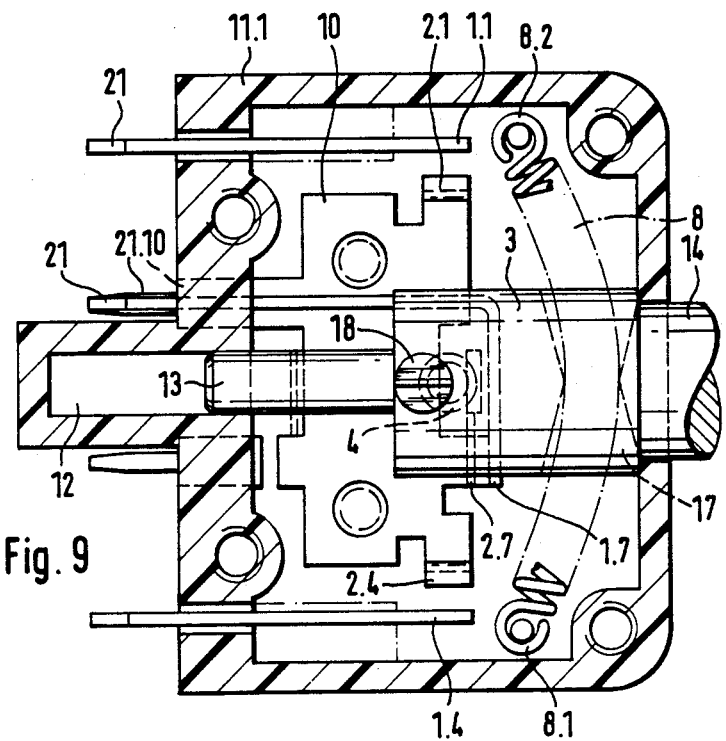
FIG. 9 is a top view as in FIG. 6 but in a pulled position of the switching plunger.
Figure 10:
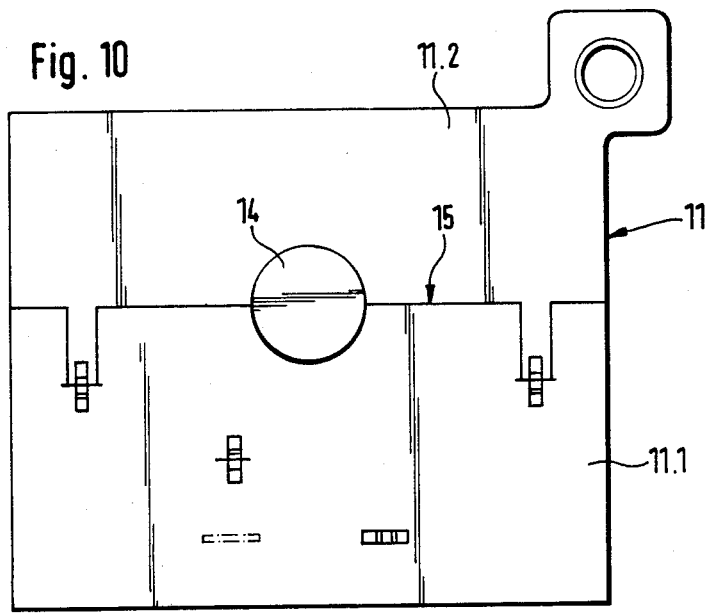
FIG. 10 is a front view of the pulse generator with the housing closed.

FIG. 8 shows the pulse generator with the plunger 3 rotated out of its rests position, and the resulting S-bend of the tension spring 8. FIG. 9 shows the pulled position of the plunger 3 and the resulting sag of the tension spring 8. A corresponding sag is obtained if pressure is exerted on the plunger 3. If the plunger 3 is pulled or depressed and simultaneously rotated, the tension spring 8 will be bent in the shape of a S and simultaneously caused to sag. After release of the plunger 3, the tension spring 8 pulls the plunger back to its rest position.

According to a further advantageous feature of the invention, the pins 16 for fastening the ends 8.1 and 8.2 of the tension spring 8 are provided on one part 11.1 of the housing, while the other part, i.e., the cover part 11.2 is provided with blind holes 23 in the areas of the pins 16. When the parts 11.1 and 11.2 of the housing are put together, the pins 16 extend into the blind holes 23 with little play. In addition, a gap 26 is formed between the basal plane 24 of the pin and the surface 25 surrounding the blind hole 23. Its height is at least equal to the thickness of the ends 8.1 and 8.2 of the tension spring 8. Thus, the tension spring 8 is securely held in position. The basal planes of the pins are preferably on or approximately on a level with the parting line 15.

We claim:

1. Pulse generator comprising a pin-shaped switching plunger capable of actuating at least one contact, characterized in that the switching plunger (3), which is guided in a housing (11), is slidable in the direction of and rotatable about its longitudinal axis (5), and that the switching plunger (3) is provided with at least one actuating member (4) which can enter into nonpositive engagement with at least one contact (2.1 to 2.8 and 1.1 to 1.8) both in any of the longitudinally shifted positions and in any of the rotated positions.

2. A pulse generator as claimed in claim 1, characterized in that tension spring (8) extends through the switching plunger (3) perpendicular to the longitudinal direction of the switching plunger (3) and is held in the housing (11) at both ends (8.1, 8.2) and that the tension spring (8) is designed as a restoring spring for restoring the switching plunger both from any pulled or depressed position and from any rotated position.

3. A pulse generator as claimed in claim 1, characterized in that the rest position of the switching plunger (3) is an intermediate switching position from which the switching plunger (3) can be moved to another switching position by pulling or depression and/or rotation.

4. A pulse generator as claimed claim 1, characterized in that the switching plunger (3) or the housing (11) has a locking projection (18) which, in at least one of the longitudinally shifted positions of the switching plunger (3), engages a recess (19) in the housing (11) or the switching plunger (3), respectively, which recess prevents any rotation of the switching plunger (3).

5. A pulse generator as claimed in claim 1, characterized in that several movable contacts (2.1 to 2.8) are arranged on a common contact plate (10) fixed in the housing (11; 11.1) and that the contact plate (10) has at least one terminal pin (21.10) which passes through a wall (22) of the housing and can be contacted from outside.

6. A pulse generator as claimed in claim 5, characterized in that the movable contacts (2 1 to 2.8) are angled perpendicular to the plane of the contact plate (10) and project into the housing (11).

7. A pulse generator as claimed in claim 4, characterized in that the actuating member (4) is diametrically opposite to the locking projection (18).

8. A pulse generator as claimed in claim 1, characterized in that the housing (11) consists of two parts, and that the parting line (15) runs in the direction of the longitudinal axis (5) of the switching plunge (3) and centrally through the bearings (12; 11.3) for the switching plunger (3).

9. A pulse generator as claimed in claim 1, characterized in that one end of the switching plunger (3) is provided with a centering pin (13) which is slidably and rotatably guided in a bushing (12).

10. A pulse generator as claimed in claim 9, characterized in that the bushing (12) is hermetically sealed on the outside.

11. A pulse generator as claimed in claim 9, characterized in that on the side opposite the centering pin (13), the switching plunger (3) is rotatably and slidably supported in the housing (11) and protrudes from the housing (11).

12. A pulse generator as claimed in claim 1, characterized in that the terminal pins (21; 21.10) are all provided on one side and arranged with a given grid spacing.

13. A pulse generator as claimed in claim 1, characterized in that the terminal pins (21; 21.10) are designed as flat contacts, and that the surface of at least one terminal pin (21; 21.10) lies in a plane other than that of the other terminal pins.

14. A pulse generator as claimed in claim 1, characterized in that at least one movable contact spring (2.1 to 2.8) has an actuating extension (9) which extends into the range of actuation of an adjacent contact, so that said movable contact spring can be actuated together with the movable contact spring of the adjacent contact.

15. A pulse generator as claimed in claim 1, characterized in that pins (16) are provided at one part (11.1) of the housing, that the other part (11.2) of the housing has blind holes (23) into which the pins (16) extend with little play, and that between the basal plane (24) of the respective pin and the surrounding surface (25) of the blind hole (23), there is a gap having a height equal to the thickness of the spring ends (8.1, 8.2).

16. A pulse generator as claimed in claim 15, characterized in that the basal planes (24) of the pins are at least approximately on a level with the parting line (15) of the housing parts (11.1; 11.2).

* * * * *